US009638758B2

(12) United States Patent
Wickert et al.

(10) Patent No.: US 9,638,758 B2
(45) Date of Patent: May 2, 2017

(54) METHOD FOR MONITORING A BATTERY PACK, BATTERY WITH A MONITORING MODULE AND A MOTOR VEHICLE WITH A CORRESPONDING BATTERY

(75) Inventors: Stefan Wickert, Albershausen (DE); Prashant Sharma, Stuttgart (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 769 days.

(21) Appl. No.: 13/985,827

(22) PCT Filed: Feb. 16, 2012

(86) PCT No.: PCT/EP2012/052711
§ 371 (c)(1), (2), (4) Date: Oct. 21, 2013

(87) PCT Pub. No.: WO2012/110611
PCT Pub. Date: Aug. 23, 2012

(65) Prior Publication Data
US 2014/0035592 A1 Feb. 6, 2014

(30) Foreign Application Priority Data
Feb. 17, 2011 (DE) ........................ 10 2011 004 281

(51) Int. Cl.
*H02J 7/00* (2006.01)
*G01R 31/36* (2006.01)
(Continued)

(52) U.S. Cl.
CPC ........ *G01R 31/3606* (2013.01); *H01M 2/344* (2013.01); *H01M 10/48* (2013.01); *H01M 2220/20* (2013.01)

(58) Field of Classification Search
CPC .................................................... H01M 10/48
(Continued)

(56) References Cited

U.S. PATENT DOCUMENTS 7,084,361 B1 * 8/2006 Bowes .................. B60L 3/0069 200/16 R
2001/0045778 A1 * 11/2001 Ando .................. H01M 2/1022 307/66
(Continued)

FOREIGN PATENT DOCUMENTS

CN 101373820 A 2/2009
DE 101 28 966 C1 10/2002
(Continued)

OTHER PUBLICATIONS

International Search Report corresponding to PCT Application No. PCT/EP2012/052711, mailed May 29, 2012 (German and English language document) (5 pages).

*Primary Examiner* — Edward Tso
*Assistant Examiner* — Ahmed Omar
(74) *Attorney, Agent, or Firm* — Maginot, Moore & Beck LLP

(57) ABSTRACT

A method is used for monitoring a battery pack to check claims under guarantee that could possibly be invalid due to incorrect opening of the battery pack. The battery pack includes at least one electrochemical cell. When the battery pack is monitored, whether the battery pack has been opened is detected and any details relating to an event of opening are recorded in a non-erasable storage medium.

6 Claims, 2 Drawing Sheets

201 High Voltage Interlock Loop
202 Battery Control Unit
200 Battery Pack
100 Memory

(51) Int. Cl.
*H01M 2/34* (2006.01)
*H01M 10/48* (2006.01)

(58) Field of Classification Search
USPC .......................................... 324/426; 320/104
See application file for complete search history.

(56) References Cited

U.S. PATENT DOCUMENTS

2009/0053588 A1 2/2009 Marukawa
2010/0136405 A1* 6/2010 Johnson ................ H01M 2/105 429/120
2011/0127958 A1* 6/2011 Ishishita ............. B60L 11/1862 320/109

FOREIGN PATENT DOCUMENTS

DE 10 2007 007 506 A1 8/2008
JP 2008-204878 A 9/2008
JP 2008204878 * 9/2008 ............ H01M 10/42

* cited by examiner

METHOD FOR MONITORING A BATTERY PACK, BATTERY WITH A MONITORING MODULE AND A MOTOR VEHICLE WITH A CORRESPONDING BATTERY

This application is a 35 U.S.C. §371 National Stage Application of PCT/EP2012/052711, filed on Feb. 16, 2012, which claims the benefit of priority to Serial No. DE 10 2011 004 281.4, filed on Feb. 17, 2011 in Germany, the disclosures of which are incorporated herein by reference in their entirety.

The present disclosure relates to a method for monitoring a battery pack, a battery having a monitoring module and a motor vehicle having a corresponding battery that are able to be used, in particular, to check guarantee claims that could possibly have lapsed as a result of unauthorized opening of the battery pack.

BACKGROUND

The battery is one of the most important and most expensive parts of an electric or hybrid vehicle. For this reason, most original equipment manufacturers (OEM) require the suppliers of battery packs to provide a guarantee for their batteries. In addition to the OEM requirements, such guarantees are also demanded by the legislation for emission-free vehicles (zero emission vehicles, ZEV), for example. Normally, the period for which a guarantee is required is between five and ten years. A further important aspect is the cost. Battery packs cost several thousand euros, and if they are returned to the supplier by the OEM, then it is extremely expensive to replace a used battery with a new one.

Since this guarantee period and the costs for batteries are not comparable with those for other vehicle parts, it is important for the suppliers of the batteries to use special measures to ensure that the battery has not been handled (improperly) by an unauthorized person.

By way of example, improper handling can involve incorrect charging/discharging of the battery and/or replacement of a sound battery with a defective or old battery.

Mishandling through incorrect charging/discharging can be identified on the basis of the prior art by using a battery data recorder that records the current supplied to the battery and drawn from the battery during charging and discharging and stores the charge state in a storage medium, such as an electrically erasable programmable read-only memory (EEPROM) or a flash EEPROM. These recordings can be evaluated at a later time outside the battery (off board) for analysis purposes or to check the validity of the guarantee claims.

A method for identifying a hand-held machine tool is known from the publication DE 10 2007 007 506 A1. To prove whether a damaged tool is an original part, this publication proposes that, in order to identify the hand-held machine tool, the housing of the hand-held machine tool be produced at least to some extent from a plastic that has an indicator component admixed with it.

No method is known to date for proving that a functional battery has been replaced with a defective or old one.

SUMMARY

A particular advantage of the disclosure is that unauthorized intervention in a battery system, particularly replacement of a functional battery with a defective one or replacement of electrochemical cells in the battery system, can be recognized. This is achieved by virtue of the disclosure involving the monitoring of battery packs, wherein opening of the battery pack is detected and recorded. A battery pack comprises at least one electrochemical cell, but preferably a multiplicity of electrochemical cells, the electrochemical cells being connected in series. In one preferred embodiment of the method according to the disclosure, at least opening of the battery pack by unauthorized persons, but preferably any opening, is documented in an inerasable storage means. For this, it is found to be advantageous if at least details about date, time of the event of the opening, the odometer reading at the time of the opening, an identifier for an opening person or the like are captured and recorded. This has the advantage that this information can be used to rate more precisely the circumstances of importance for assessing the guarantee claims. One preferred embodiment of the disclosure provides for the storage medium used to be a ring memory. This optimizes memory use, since only a storage space of prescribed size is used by virtue of storage of a new entry prompting older entries to be “pushed out” of the memory when the memory is full. Preferably, at least the detection and/or recording of the details take place automatically.

In one preferred embodiment of the disclosure, the monitoring is performed by a battery control unit (BCU). In this case, it is possible to resort to already existing software and hardware, as a result of which the involvement for implementing the disclosure is kept low. It is found to be advantageous if the BCU comprises a hardware switching inhibitor, such as a high voltage monitoring loop (high voltage interlock loop, HVIL), and the monitoring comprises evaluation of the signals provided by the hardware switching inhibitor. However, it may also turn out to be advantageous if the monitoring takes place independently of the BCU. In this case, hardware and/or software components may be provided for the monitoring.

In a further preferred embodiment, phases are provided in which the battery control unit is in a quiescent mode in order to minimize the energy consumption. However, the monitoring also remains active while the battery control unit is in a quiescent state. In particular, the HVIL also remains active during phases of the quiescent mode of the BCU.

In another preferred embodiment, the battery pack has a locking mechanism. Such a locking mechanism can be used to prevent the battery pack from being opened by unauthorized persons or the battery pack being opened unnoticed by unauthorized persons. It is found to be advantageous if the locking mechanism is in the form of a magnetic, preferably electromagnetic, closure.

One preferred embodiment in this case provides for a person to be ascertained as being authorized for opening by virtue of an authorization check being performed prior to the opening. Preferably, the authorization check is performed by the BCU. With particular preference, the check is performed as a dialog between the person and the BCU, with commands from a unified diagnostic service (UDS), preferably being sent at least to some extent within the dialog.

It is also found to be advantageous if the locking mechanism of the battery pack can be locked by an authorized person. Preferably, the authorization check for this purpose is performed in a similar manner to the authorization check for opening the battery pack.

Another preferred embodiment provides for the battery pack to be able to be opened even without authorization. This is advantageous particularly in hazard situations. It is found to be advantageous if, in prescribable cases, the locking is (automatically) disengaged by the BCU so that the battery pack can be opened without damage. Alternatively or in parallel therewith, provision may be made for the locking to be able to be disengaged by force even without clearance and for the battery pack to be able to be opened. For example, this may involve the provision that such forcible opening prompts a seal or predetermined breaking point to be damaged in order to document the opening. In addition, the opening can also be documented by virtue of details about the event of the opening being written to a preferably inerasable storage means in the same way as when the opening is documented in the monitoring method described above.

A further aspect of the disclosure relates to a battery having a module for monitoring a battery pack, wherein the module is set up such that a method for monitoring the battery pack can be performed, wherein the battery pack comprises at least one electrochemical cell and wherein opening of the battery pack is detected and recorded. Preferably, the battery is a lithium ion battery or the battery comprises electrochemical cells that are in the form of lithium ion battery cells.

Another aspect of the disclosure relates to a motor vehicle having an electric drive motor for driving the motor vehicle, and a battery according to the disclosed aspect described in the preceding paragraph that is connected or can be connected to the electric drive motor. The battery is not limited to such an intended use, however, but can also be used in other electrical systems.

The disclosure presents a method that ensures that battery packs that have been returned to the supplier by an OEM (following a fault report) have not actually been handled incorrectly by a repair workshop, filling station or other unauthorized locations or persons.

In particular, the disclosure has the advantage that in contrast to the prior art, there is the opportunity for the BCU to ascertain whether or not the battery pack has been opened by an unauthorized person. Ascertaining these circumstances allows the guarantee claims of an OEM to be checked.

The disclosure also ensures that an unauthorized person is unable to open the battery pack.

Advantageous developments of the disclosure are specified below and are described in the description.

BRIEF DESCRIPTION OF THE DRAWINGS

Exemplary embodiments of the disclosure are explained in more detail with reference to the drawings and the description that follows. In the drawings.

DETAILED DESCRIPTION

The disclosure is described below with reference to two exemplary embodiments. An important aspect of the disclosure is that of equipping a battery pack with a monitoring mechanism. In addition, a further embodiment has provision for the battery pack to be equipped with a closure mechanism. In this case, the monitoring and closure mechanisms may each be provided alone or jointly in combination. One preferred embodiment in this case provides for the scope of functions of the BCU to be used for controlling the monitoring and/or closure mechanism.

Figure 3:
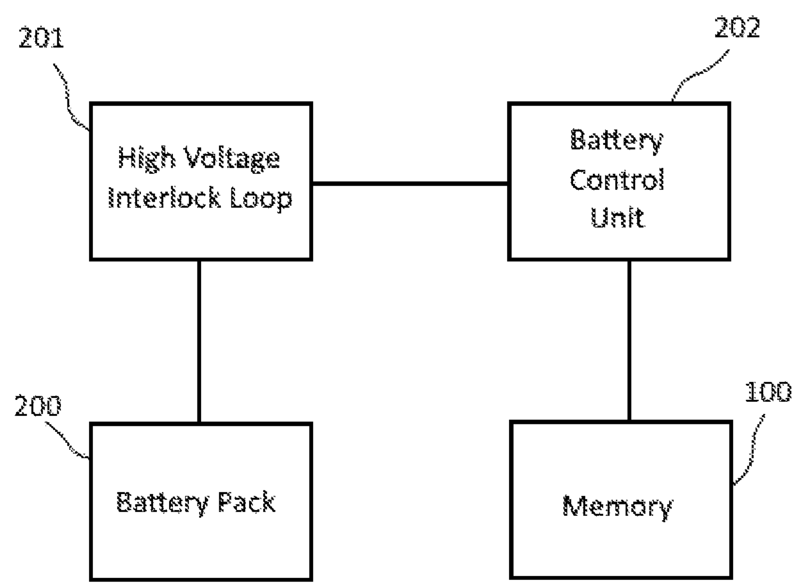
FIG. 3 is a block diagram that schematically depicts components of the battery management system including the battery pack, high voltage interlock loop, battery control unit and memory.

Monitoring Mechanism:

Referring to FIG. 3, when used as a monitoring device, the BCU 202 monitors opening of the battery pack 200. This is achieved by virtue of an already present hardware switching inhibitor of the battery management system (BMS) being used. By way of example, a high voltage monitoring loop (HVIL) 201 can be used as such a hardware switching inhibitor. A hardware switching inhibitor allows the ascertainment of unconnected standalone contacts in order to prevent people from coming into contact with lines carrying high voltage. This hardware switching inhibitor comprises a PWM (pulse width modulation) signal generator of the BMS, which PWM signal generator applies its signals to a series of loop contacts. When the high voltage connection is not connected, the chain is interrupted. An interrupted chain of this kind is recognized by the hardware switching inhibitor of the BMS, which in this case no longer receives a PWM signal. In this case, the BMS immediately isolates all contacts. Furthermore, all other active components that are capable of emitting high voltage to the bus are likewise prevented from outputting high voltage to the bus. Hence, the hardware switching inhibitor ensures that the battery pack cannot be opened without the BCU 202 being informed of the opening of the battery pack. In order to prevent the BCU software from being constantly active, a quiescent mode can be provided for the BCU 202 when the ignition is switched off. The BCU software can be woken again by an HVIL event. Such a quiescent mode helps to save energy.

This mechanism allows the BCU to capture and record any opening of the battery pack. The BCU monitors the signals from the hardware switching inhibitor (HVIL signals) and is thus provided with a pulse when the battery pack is opened. After it has received the pulse, the BCU stores data that describe the event, such as date 102, time 104, odometer reading 106, an examiner identifier 108 or the like, in its inerasable memory. Preferably, these data should not be able to be erased, not even by an OEM examiner.

Figure 1:
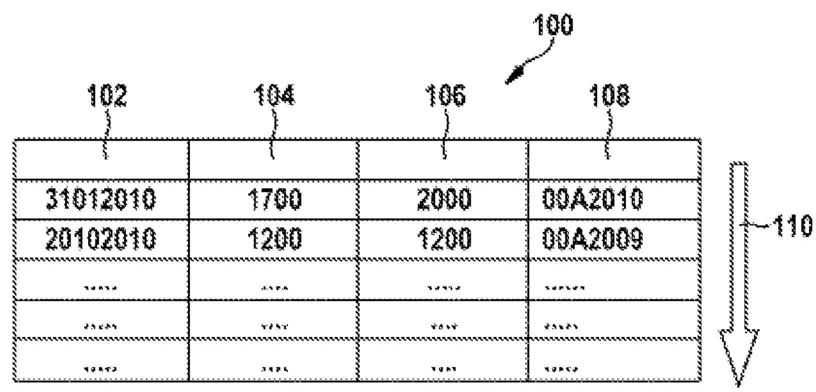
FIG. 1 shows an illustration of exemplary memory management for storing details that document opening.

In the exemplary embodiment, the BCU ensures that every "open battery pack" event is detected and the relevant data are stored in the inerasable memory. In order to optimize memory use, the BCU provides a ring memory 100 of prescribed length. When new entries are stored in the ring memory 100, the entries that are already stored are shifted onward, as illustrated in FIG. 1 by the reference symbol 110. When the ring memory 100 is full, the older entries are erased (cf. FIG. 1).

When an OEM now sends a defective battery pack to the supplier, the supplier can check whether or not the battery pack has been opened by anyone. If the battery pack has been opened, the date 102 and the time 104 of the opening can be read from the BCU. These details can be used by the supplier to establish whether the guarantee claims are legitimate.

Since it may occur that the BCU is in the quiescent mode when the battery pack is opened by someone, one preferred embodiment provides for opening to prompt a wake signal to be sent.

Closure and Monitoring Mechanism:

Although the monitoring mechanism described in the preceding paragraph ensures that the BCU 202 always recognizes when the battery pack has been opened, and documents these events, this method cannot be used to prevent the battery pack from being opened by unauthorized persons.

In order to prevent such unauthorized opening, a second exemplary embodiment has provision for closure for the battery pack. The closure prevents the battery pack from being able to be opened without adequate authentication. The closure is controlled and monitored by the BCU 202. Accordingly, opening is allowed only for authorized persons, such as an authorized examiner 204.

To allow opening, the relevant person sends a sequence of commands, such as commands from a unified diagnostic service, to the BCU 202. Using these commands, the BCU 202 makes a decision about the authorization of the person and takes this decision as a basis for allowing access and disengages the closure of the battery pack. Preferably, this is a magnetic closure.

Figure 2:
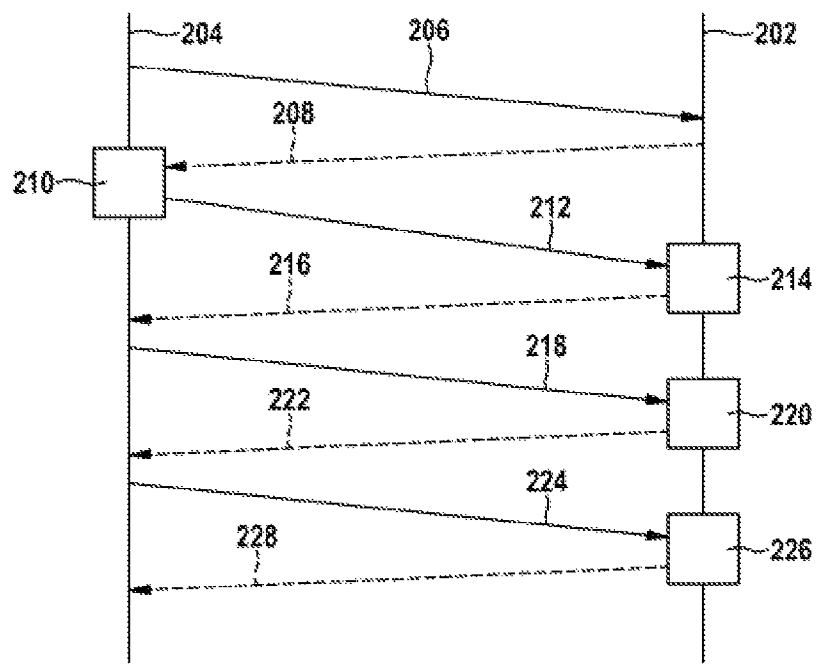
FIG. 2 shows an illustration of a dialog from an exemplary authorization check.

An exemplary command sequence is described with reference to FIG. 2:

The examiner 204 sends the UDS command 206 "Security access—Request seed" to the BCU 202.

The BCU 202 responds by sending 208 a seed.

The examiner 204 uses this seed and calculates a key in step 210 by using a security algorithm. The key generated in this manner is sent to the BCU 202 with the UDS command 212 "Security access—Send key".

The BCU 202 uses the same seed and authenticates the key in step 214. For this the BCU 202 generates the check key with an algorithm within the memory. Next, the BCU 202 compares the key received from the examiner 204 with the check key. If the keys match the BCU 202 sends a message 216 in order to provide the examiner 204 with the authorization to input further commands. In the event of failed authentication, the message 216 that the BCU 202 sends after the authentication may also contain notification that access is denied.

The examiner 204 sends various details 218 identifying him to the BCU 202, such as an examiner identifier 108, an examiner type or the like. In step 220 the BCU 202 stores these details 218 in an inerasable memory.

The BCU 202 sends a report 222 in order to signal the successful storage of the details 218 to the examiner 204.

Next, the examiner 204 sends the UDS command 224 for opening the battery pack to the BCU 202 in order to open the magnetic closure by sending the UDS command 224 "Routine Control".

Following receipt of this UDS command 224, the BCU 202 disengages the magnetic closure in step 226 and signals this to the examiner 204 by sending a report 228.

A similar command sequence can be used in order to lock the magnetic closure.

For security reasons, one exemplary embodiment provides for the BCU 202 to open the closure without any request from an examiner 204 when the BCU 202 establishes a hazard situation. In another exemplary embodiment, provision is also made for the magnetic closure to be able to be opened even without authorization, for example by using mechanical force. In the case of a magnetic closure, this could be achieved by choosing the magnet force accordingly. Such a closure that can be opened by force would render unauthorized opening apparent without preventing opening in any case, which is of particular importance for hazard situations.

The use of the disclosure ensures that the battery pack cannot be opened without authorization being proved. Furthermore, the BCU 202 records whether the battery pack has been opened, and details about time 104, date 102 and/or odometer reading 106 are stored in the cases of opening. In addition, information about persons who open the battery pack with authorization is stored. This approach allows the guarantee claims of an OEM to be rated.

The form of implementation of the disclosure is not limited to the preferred exemplary embodiments indicated above. On the contrary, a number of variants are conceivable that make use of the method according to the disclosure, the battery according to the disclosure and the motor vehicle according to the disclosure even with embodiments of a fundamentally different nature.

The invention claimed is:

1. A method for monitoring a battery pack having at least one electrochemical cell, the method comprising:

detecting and recording an opening of the battery pack, wherein detecting the opening includes monitoring a signal from a hardware switching inhibitor using a battery control unit, and wherein the hardware switching inhibitor comprises a high voltage interlock loop, and wherein the battery pack has a locking mechanism which is controlled by the battery control unit, and wherein the battery control unit is configured to unlock the locking mechanism based on a result of an authorization check.

2. The method as claimed in claim 1, further comprising: storing details about the opening in a storage medium.

3. The method as claimed in claim 2, wherein the storage medium is a ring memory.

4. The method as claimed in claim 1, wherein:

the battery control unit is in a quiescent mode during phases, and the hardware switching inhibitor is active during the phases.

5. A battery, comprising:

a battery pack having at least one electrochemical cell;

a high voltage interlock loop that generates a signal indicative of a state of a high voltage connection of the at least one electrochemical cell;

a module configured to monitor the signal a battery pack having at least one electrochemical cell; and a battery control unit, wherein the module is configured such that an opening of the battery pack is detected and recorded in memory when the signal indicates that the high voltage connection is not connected detectable and recordable, wherein the battery pack has a locking mechanism which is controlled by the battery control unit, and wherein the battery control unit is configured to unlock the locking mechanism based on a result of an authorization check.

6. A motor vehicle, comprising:

an electric drive motor configured to drive the motor vehicle; and a battery connected to or connectable to the electric drive motor, the battery including:

a battery pack having at least one electrochemical cell;

a high voltage interlock loop that generates a signal indicative of a state of a high voltage connection of the at least one electrochemical cell;

a module configured to monitor the signal a battery pack having at least one electrochemical cell; and a battery control unit, wherein the module is configured such that an opening of the battery pack is detected and recorded in memory when the signal indicates that the high voltage connection is not connected detectable and recordable, wherein the battery pack has a locking mechanism which is controlled by the battery control unit, and wherein the battery control unit is configured to unlock the locking mechanism based on a result of an authorization check.

* * * * *